(12) United States Patent
Rideau et al.

(10) Patent No.: US 9,543,214 B2
(45) Date of Patent: *Jan. 10, 2017

(54) METHOD OF FORMING STRESSED SEMICONDUCTOR LAYER

(71) Applicants: STMicroelectronics SA, Montrouge (FR); STMicroelectronics (Crolles 2) SAS, Crolles (FR); STMicroelectronics, Inc., Coppell, TX (US)

(72) Inventors: Denis Rideau, Grenoble (FR); Elise Baylac, Les Adrets (FR); Emmanuel Josse, La Motte Servolex (FR); Pierre Morin, Albany, NY (US); Olivier Nier, Varces (FR)

(73) Assignees: STMICROELECTRONICS SA, Montrouge (FR); STMICROELECTRONICS (CROLLES 2) SAS, Crolles (FR); STMICROELECTRONICS, INC., Coppell, TX (US)

(*) Notice: Subject to any disclaimer, the term of this patent is extended or adjusted under 35 U.S.C. 154(b) by 11 days.

This patent is subject to a terminal disclaimer.

(21) Appl. No.: 14/526,081

(22) Filed: Oct. 28, 2014

(65) Prior Publication Data

US 2015/0118805 A1 Apr. 30, 2015

(30) Foreign Application Priority Data

Oct. 31, 2013 (FR) ..................................... 13 60676

(51) Int. Cl.
*H01L 21/8234* (2006.01)
*H01L 21/84* (2006.01)
(Continued)

(52) U.S. Cl.
CPC . *H01L 21/823481* (2013.01); *H01L 21/02356* (2013.01); *H01L 21/02532* (2013.01);
(Continued)

(58) Field of Classification Search
CPC ........... H01L 21/02532; H01L 27/0924; H01L 27/1203; H01L 21/265; H01L 29/7831; H01L 29/7846; H01L 21/76237; H01L 21/324; H01L 29/7847; H01L 21/84; H01L 27/0984; H01L 21/02356
See application file for complete search history.

(56) References Cited

U.S. PATENT DOCUMENTS 5,796,126 A 8/1998 Han et al.
5,902,128 A 5/1999 Mathews et al.
(Continued)

OTHER PUBLICATIONS

Shen et al., "Molecular Dynamic Simulation Study of Stress Memorization in Si Dislocations," Electron Devices Meeting (IEDM), 2012 IEEE International, Dec. 10-13, 2012, pp. 30.1.1-30.1.4.

*Primary Examiner* — Alonzo Chambliss
(74) *Attorney, Agent, or Firm* — Seed IP Law Group LLP

(57) ABSTRACT

The invention concerns a method of forming a semiconductor layer having uniaxial stress including: forming, in a semiconductor structure having a stressed semiconductor layer, one or more first isolation trenches in a first direction for delimiting a first dimension of at least one transistor to be formed in said semiconductor structure; forming, in the semiconductor structure, one or more second isolation trenches in a second direction for delimiting a second dimension of the at least one transistor, the first and second isolation trenches being at least partially filled with an insulating material; and before or after the formation of the second isolation trenches, decreasing the viscosity of the insulating material in the first isolation trenches by implant-
(Continued)

ing atoms of a first material into the first isolation trenches, wherein atoms of the first material are not implanted into the second isolation trenches.

22 Claims, 10 Drawing Sheets

(51) Int. Cl.
| | |
|---|---|
| H01L 21/762 | (2006.01) |
| H01L 29/78 | (2006.01) |
| H01L 21/02 | (2006.01) |
| H01L 21/265 | (2006.01) |
| H01L 21/3115 | (2006.01) |
| H01L 21/308 | (2006.01) |
| H01L 21/3105 | (2006.01) |
| H01L 21/324 | (2006.01) |
| H01L 27/12 | (2006.01) |

(52) U.S. Cl.
CPC ........ *H01L 21/265* (2013.01); *H01L 21/3081* (2013.01); *H01L 21/3105* (2013.01); *H01L 21/31155* (2013.01); *H01L 21/76224* (2013.01); *H01L 21/76237* (2013.01); *H01L 21/823431* (2013.01); *H01L 21/845* (2013.01); *H01L 29/7831* (2013.01); *H01L 29/7846* (2013.01); *H01L 29/7847* (2013.01); *H01L 21/26506* (2013.01); *H01L 21/324* (2013.01); *H01L 27/1203* (2013.01)

(56) References Cited

U.S. PATENT DOCUMENTS

| | | | |
|---|---|---|---|
| 7,700,416 | B1 | 4/2010 | Clifton et al. |
| 9,240,466 | B2 * | 1/2016 | Morin .................... H01L 21/84 |
| 9,305,828 | B2 * | 4/2016 | Rideau .................... H01L 21/84 |
| 9,318,372 | B2 * | 4/2016 | Nier .................. H01L 21/76283 |
| 9,331,175 | B2 * | 5/2016 | Morin ............... H01L 29/66772 |
| 2005/0133864 | A1 | 6/2005 | Iwamatsu et al. |
| 2008/0150037 | A1 | 6/2008 | Teo et al. |
| 2009/0057775 | A1 | 3/2009 | Shin |
| 2012/0049280 | A1 | 3/2012 | Clifton et al. |
| 2012/0108032 | A1 | 5/2012 | Yin et al. |
| 2012/0302038 | A1 | 11/2012 | Zheng et al. |

* cited by examiner

METHOD OF FORMING STRESSED SEMICONDUCTOR LAYER

BACKGROUND

Technical Field

The present disclosure relates to the field of stressed semiconductor layers, and in particular to a method for forming a stressed semiconductor layer.

Description of the Related Art

The performance of certain types of transistors such as p-channel and n-channel MOS transistors can be greatly improved by the introduction of stress into the channel region.

In particular, for PMOS transistors, the presence of compressive stress in the channel region generally leads to an increase in hole mobility, and thus an improvement in terms of switching speed.

For NMOS transistors, the presence of tensile stress in the channel region generally leads to an increase in the electron mobility, and thus an improvement in terms of switching speed.

However, existing transistor processing methods generally lead to transistors having channels that are stressed in a non-optimal fashion, leading to non-optimal transistor performance. There is thus a need for a method of forming a stressed semiconductor layer leading to increased transistor performance.

BRIEF SUMMARY

One or more embodiments are directed to the field of stressed semiconductor layers, and in particular to a method for forming a stressed semiconductor layer According to one embodiment, there is provided a method of forming a semiconductor layer having uniaxial stress comprising: forming, in a semiconductor structure comprising a stressed semiconductor layer, one or more first isolation trenches in a first direction for delimiting a first dimension of at least one transistor to be formed in the semiconductor structure; forming, in the semiconductor structure, one or more second isolation trenches in a second direction for delimiting a second dimension of the at least one transistor, the first and second isolation trenches being at least partially filled with an insulating material; and before or after the formation of the second isolation trenches, decreasing the viscosity of the insulating material in the first isolation trenches by implanting atoms of a first material into the first isolation trenches, wherein atoms of the first material are not implanted into the second isolation trenches.

According to one embodiment, the first material is boron or phosphor.

According to one embodiment, the semiconductor structure further comprises at least one further layer overlying the stressed semiconductor layer, the method further comprising: after the implantation, removing the at least one further layer.

According to one embodiment, each of the at least one first transistor is a p-channel MOS transistor, and the first dimension is the width of the at least one first transistor; or each of the at least one first transistor is an n-channel MOS transistor, and the first dimension is the length of the at least one first transistor.

According to one embodiment, the method further comprises, prior to the implantation, forming, in the semiconductor structure, at least two third trenches in the second direction delimiting the second dimension of at least one second transistor to be formed in the semiconductor structure, wherein: the at least one first transistor is a p-channel MOS transistor and the first dimension is the width of the at least one first transistor; and the at least one second transistor is an n-channel MOS transistor and the second dimension is the length of the at least one second transistor.

According to one embodiment, the stressed semiconductor layer is part of a bulk semiconductor layer.

According to one embodiment, the semiconductor layer comprises a plurality of semiconductor fins.

According to one embodiment, the semiconductor structure is a semiconductor on insulator (SOI) structure, the semiconductor layer being in contact with an insulator layer.

According to one embodiment, the method further comprises, prior to forming the one or more first isolation trenches: forming, in a surface of the semiconductor structure at least two initial trenches in the first direction; introducing, via the at least two initial trenches, a stress in the initial semiconductor layer to provide the stressed semiconductor layer; temporally decreasing, by annealing, the viscosity of the insulator layer while maintaining the stress in the semiconductor layer; and extending the depth of the at least two initial trenches to form the first isolation trenches.

According to one embodiment, introducing a stress in the semiconductor layer comprises the introduction of a first material into the SOI structure via the at least two initial trenches, and extending the at least two initial trenches comprises at least partially removing the first material.

According to one embodiment, the introduction of the first material comprises: implanting atoms of the first material into a region of the semiconductor layer underlying each of the at least two initial trenches; or depositing the first material to at least partially fill each of the at least two initial trenches.

According to one embodiment, the method further comprises, after forming the first isolation trenches and before forming the second isolation trenches: performing a first anneal to decrease the viscosity of the insulator layer.

According to one embodiment, the method further comprises, after forming the second isolation trenches: performing a second anneal to decrease the viscosity of the insulator material of the first and second isolation trenches.

According to one embodiment, the first anneal has a temperature and/or duration that is greater than the second anneal.

According to one embodiment, the first anneal is performed at a temperature of between 1000° C. and 1150° C.; and the second anneal is performed at a temperature of between 900 and 1000° C.

According to one embodiment, the first anneal is performed for a duration of between 30 and 90 minutes; and the second anneal is performed for a duration of between 15 and 30 minutes.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

DETAILED DESCRIPTION

Figure 1A:
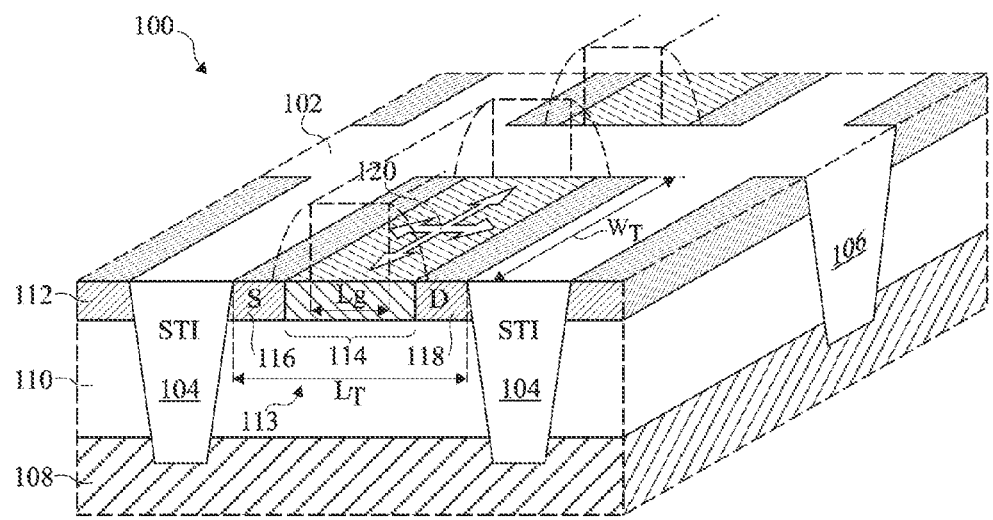
FIG. 1A is a perspective view of a portion of a semiconductor on insulator (SOI) structure comprising transistors according to an example embodiment of the present disclosure.

FIG. 1A is a perspective view of a portion 100 of a semiconductor on insulator (SOI) structure. The SOI structure comprises a grid 102 of isolation trenches, which are for example shallow trench isolations (STI), delimiting transistors. In particular, vertical trenches 104, of which two are illustrated in the portion 100 of FIG. 1A, delimit one dimension of each transistor, while horizontal trenches 106, of which one is illustrated in FIG. 1A, delimit another dimension of each transistor. Throughout the present description, the term "vertical" is used to designate a direction of the trenches depicted as generally running from top to bottom on the page, while the term "horizontal" is used to designate a direction of the trenches depicted as generally running from left to right on the page.

In the example of FIG. 1A, the SOI structure comprises a substrate 108, for example formed of bulk silicon, a layer of insulator 110 formed over the substrate 108, and a semiconductor layer 112, formed over and in contact with the insulator layer 110. The insulator layer 110 is for example between 20 and 50 nm in thickness, and corresponds to a buried oxide layer. The semiconductor layer 112 is for example between 5 and 20 nm in thickness. The semiconductor layer 112 is for example formed of silicon or SiGe.

The isolation trenches 104, 106 for example extend through the semiconductor layers 112 and at least partially into the insulator layer 110. In the example of FIG. 1A, the trenches 104, 106 also extend into the substrate 108. The isolation trenches 104, 106 for example have a depth of between 7 and 300 nm.

FIG. 1A illustrates an example of a portion of a transistor 113 formed in the semiconductor layer 112, and delimited by the isolation trenches 104 and 106. The transistor 113 is for example a p-channel or n-channel MOS transistor. In the example of FIG. 1A, the transistor 113 comprises, between the two trenches 104, a central channel region 114, and source and drain regions 116, 118 on respective sides of the channel region 114. The source and drain regions 116, 118 are for example heavily doped regions of the semiconductor layer 112.

As represented by dashed lines in FIG. 1A over the channel region 114 of transistor 113, a gate stack will for example be formed having spacers partially overhanging the source and drain regions 116, 118. The gate length $L_g$ of the transistor is defined as the length of the gate in the direction perpendicular to direction that the isolation trenches 104 are formed. In the same direction as the gate length $L_g$, a transistor length $L_T$ is defined herein as the length of the transistor from the outer edge of the source region 116 to the outer edge of the drain region 118. This transistor length $L_T$ corresponds to the distance between the inner edges of the isolation trenches 104 that delimit the transistor, and is for example in the range 50 to 150 nm.

In the perpendicular direction to the gate length $L_g$, and in the same direction as the one in which the isolation trenches 104 are formed, a transistor width $W_T$ is defined herein as the width of the semiconductor layer 112 between the pair of isolation trenches 106 that delimit the transistor, and is for example in the range 50 to 100 nm. In the example of FIG. 1A, for ease of illustration, only one of the isolation trenches 106 delimiting the transistor width $W_T$ of transistor 113 is illustrated.

The isolation trenches 104 and 106 for example have inclined sides, and the transistor lengths $L_T$ and widths $W_T$ are for example measured from the widest section of the trenches, which is for example at the surface of the semiconductor layer 112.

While not illustrated in FIG. 1A, there may be hundreds or thousands of p-channel or n-channel transistors formed in the SOI structure and delimited by the grid 102 of isolation trenches 104, 106. Each of these transistors is for example orientated in the same direction, for example having a transistor length $L_T$ in the horizontal direction, and a transistor width $W_T$ in the vertical direction.

As shown by biaxial arrows 120 positioned over the channel region 114 of the semiconductor layer 112 in FIG. 1A, the semiconductor layer 112 is for example stressed. This stress can be a compressive stress, or a tensile stress, and may be biaxial, in other words in both the directions of the transistor length $L_T$ and width $W_T$, or uniaxial, in other words in either the direction of the transistor length $L_T$, or in the direction of the transistor width $W_T$. However, the term "uniaxial stress" will also be used to cover the case in which there is biaxial stress, but the stress levels are different along the transistor's length and width, the stress along one of these directions being for example relatively low or negligible.

Figure 1B:
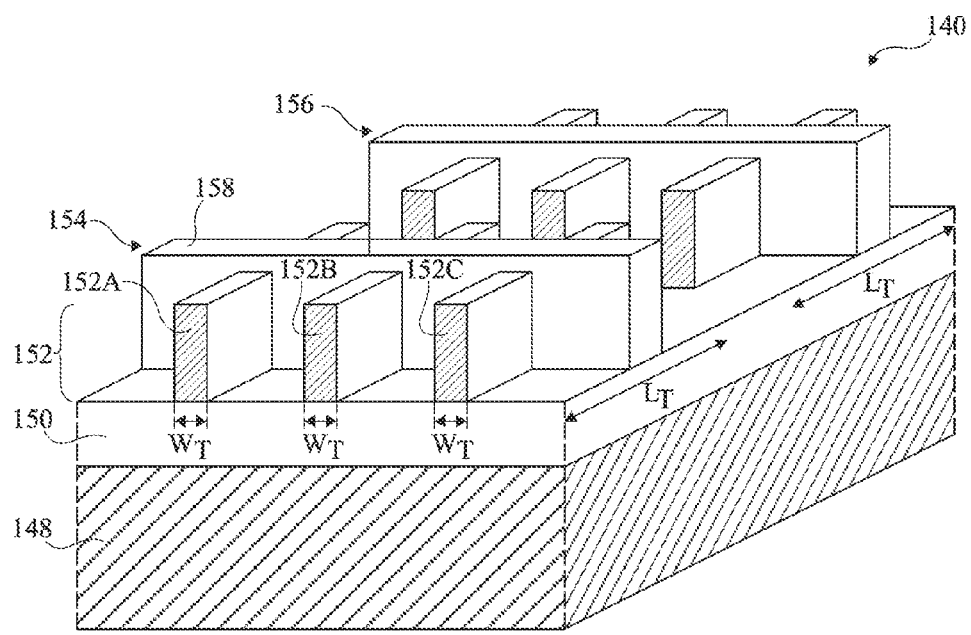
FIG. 1B is a perspective view of a portion of a semiconductor structure comprising transistors according to a further example embodiment of the present disclosure.

FIG. 1B is a perspective view of a portion 140 of a semiconductor structure according to an alternative embodiment based on finFET transistors.

The semiconductor structure 140 comprises a substrate 148, for example formed of bulk silicon, and a layer of insulator 150 formed over the substrate 148. A semiconductor layer 152 is formed over and in contact with the insulator layer 150, and comprises semiconductor fins defining two transistor devices 154, 156 positioned side by side. The device 154 comprises fins 152A, 152B, 152C, each corresponding to a separate transistor, having a p-type or n-type channel, and controlled by a common gate 158 formed substantially perpendicular to the fins 152A to 152C, and covering a mid-portion of each of the fins. The insulator layer 150 is for example between 20 and 50 nm in thickness and corresponds to a buried oxide layer. The semiconductor layer 152, and in particular each of the fins 152A to 152C, is for example between 20 and 50 nm in thickness. The fins are for example formed of silicon or SiGe. The device 156 is for example identical to device 154.

The width $W_T$ of each transistor in the structure of FIG. 1B corresponds to the width of each fin, while the length $L_T$ of each transistor for example corresponds to the length of each fin. In order to form the fins of the transistors, trenches are for example formed in one direction between the fins to delimit the width $W_T$ of each transistor fin, and further trenches are for example formed in the perpendicular direction to delimit the length of each transistor fin.

The isolation trenches 104, 106 of FIG. 1A or fins of FIG. 1B are for example formed during first and second phases, each involving a separate photolithography operation, as will now be described with reference to FIGS. 2A, 2B, 3A and 3B.

Figure 2A:
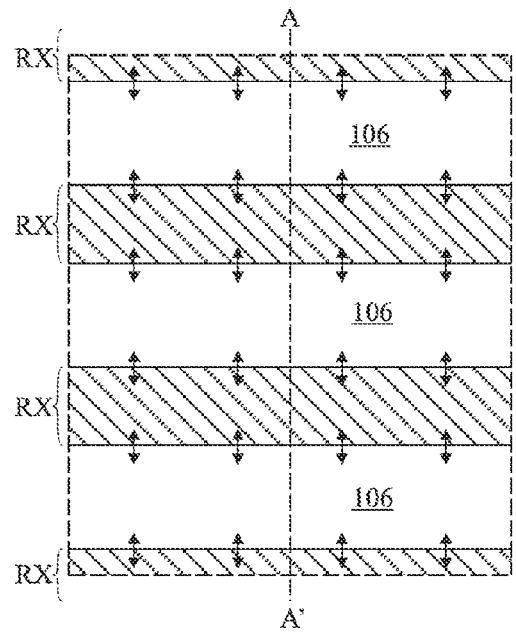
FIGS. 2A and 2B are plan views of masks used for forming trenches in the semiconductor structure of FIG. 1A or 1B during a method of forming a stressed semiconductor layer according to an example embodiment of the present disclosure.

FIG. 2A represents, in plan view, an example of a mask, referred to as an RX mask, used during a first phase to form the horizontal isolation trenches 106 of the SOI structure of FIG. 1A or to delimit the widths $W_T$ of the fins of FIG. 1B, according to an example embodiment, three trenches 106 being illustrated in FIG. 2A. Diagonally striped rectangular zones running from left to right in FIG. 2A represent the zones, labelled RX, on either side of the isolation trenches 106 in which the mask is present. The isolation trenches 106 for example have a width of between 30 and 300 nm.

Figure 2B:
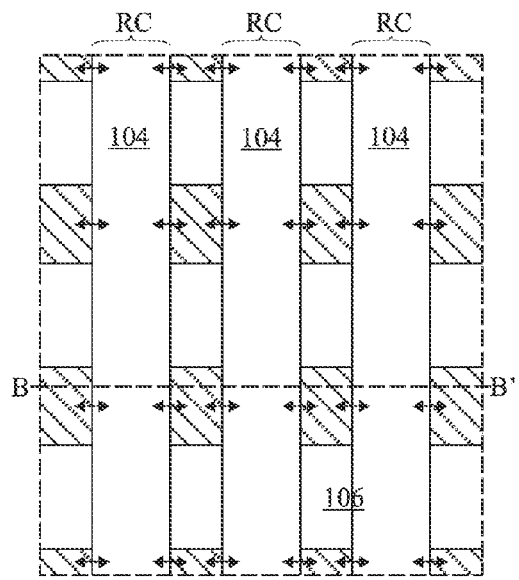

FIG. 2B represents, in plan view, an example of another mask, referred to as an RC mask, used during a second phase to form the vertical isolation trenches 104 of the SOI structure of FIG. 1A or to delimit the lengths $L_T$ of the fins of FIG. 1B, according to an example embodiment, three trenches 104 being illustrated in FIG. 2B. In this example, the RC mask is applied after the RX mask of FIG. 2A has already been used to form the isolation trenches 106. Blank zones, labelled RC, running from top to bottom in FIG. 2B represent the zones in which the isolation trenches 104 are formed. The isolation trenches 104 for example have a width of between 30 and 300 nm.

Figure 3A:
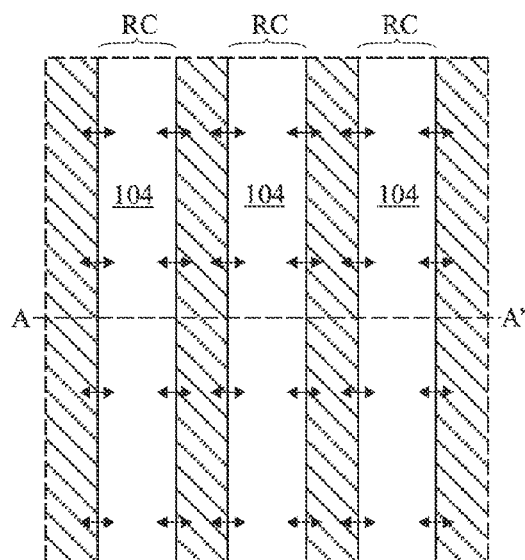
FIGS. 3A and 3B are plan views of masks used for forming trenches in the semiconductor structure of FIG. 1A or 1B during a method of forming a stressed semiconductor layer according to a further example embodiment of the present disclosure.
Figure 3B:
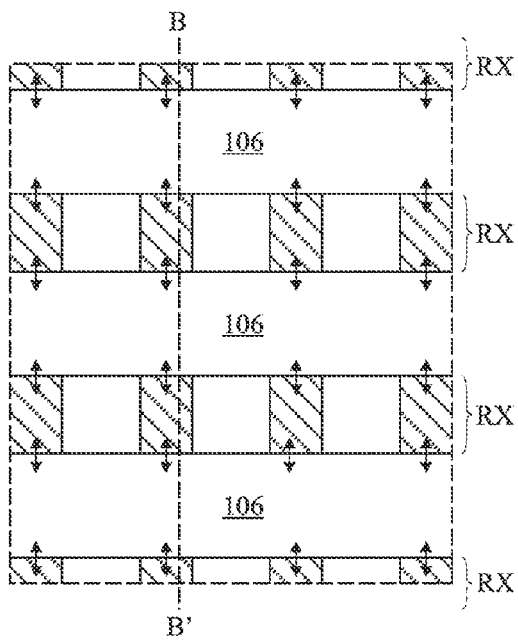

FIGS. 3A and 3B show similar plan views to those of FIGS. 2A and 2B respectively, but corresponding to the case that the RC mask is applied during the first phase as shown in FIG. 3A, and the RX mask is applied during the second phase as shown in FIG. 3B.

Methods of applying stress to the semiconductor layer 112 of FIG. 1A will now be described with reference to the cross-section views of FIGS. 4A to 4C, FIGS. 5A to 5C, and FIGS. 6A to 6D. Such methods are for example used to apply a uniaxial stress, but in some embodiments these methods could equally be used to apply a biaxial stress, if for example applied along both the transistor widths and lengths. Furthermore, in some embodiments, the semiconductor layer 112 may be pre-stressed to a certain level, and the methods described hereafter can be used to uniaxially enhance the stress, uniaxially relax the stress and/or uniaxially change the stress from a tensile stress to a compressive stress, or vice versa. Furthermore, it will be apparent to those skilled in the art how the teaching could equally be applied to the finFET embodiment of FIG. 1B.

FIGS. 4A to 4C and 5A to 5C are cross-section views corresponding to cross-sections taken along the dashed line A-A' shown in FIG. 2A, in the vertical direction and passing perpendicular to the mask zones RX. The cross-sections of FIGS. 4A to 4C and 5A to 5C also correspond to cross-sections taken along the dashed line A-A' shown in FIG. 3A, in the horizontal direction and passing perpendicular to the mask zones RC. In other words, the horizontal and vertical trenches 106, 104 being formed in first and second phases, these methods are for example applied during the first phase corresponding to FIGS. 2A and 3A. Alternatively, it will be apparent from the following description that these methods could additionally or alternatively be applied during the second phase corresponding to FIGS. 2B and 3B.

Figure 4A:
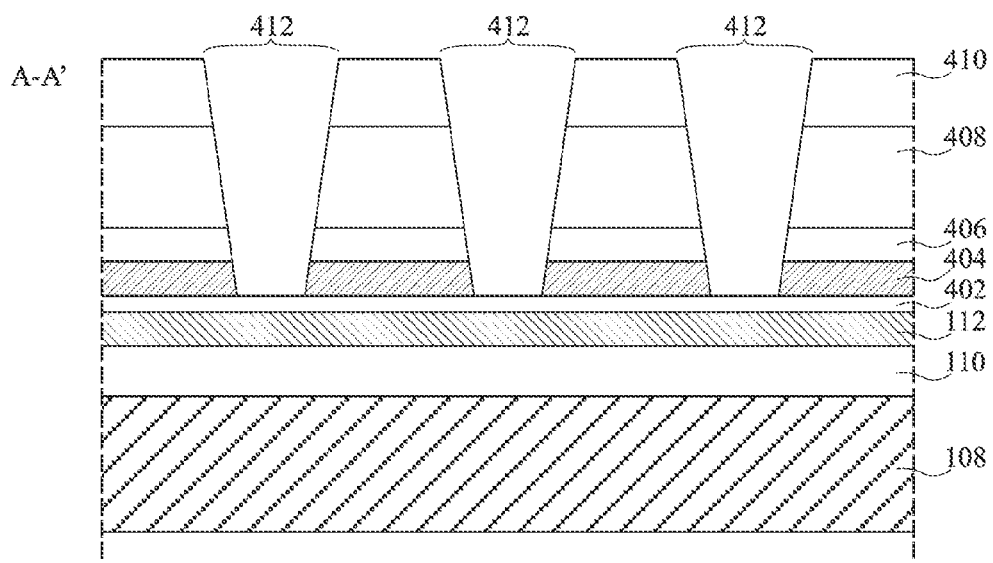
FIGS. 4A to 4C are cross-section views of an SOI structure at various stages during a method of forming a stressed semiconductor layer according to an example embodiment of the present disclosure.

With reference to FIG. 4A, it is assumed that the structure initially comprises the substrate 108, insulator layer 110, and semiconductor layer 112, and that the following layers have also been formed over the SOI structure:

a sacrificial oxide layer 402 overlying the semiconductor layer 112, for example used during well implantation;

a layer 404 of SiN, for example of between 40 and 60 nm in thickness, formed over layer 402;

a hard mask layer 406, for example of between 40 and 60 nm, formed of TEOS or another suitable material, and formed over the layer 404;

a spin-on carbon (SOC) and/or silicon anti-reflective coating (SiARC) layer 408 formed over the hard mask layer 406, and for example having a thickness of between 200 and 300 nm; and a photo resist layer 410 formed over layer 408, and for example having a thickness of between 100 and 200 nm.

It will be apparent to those skilled in the art that one or more of the above layers could be omitted in some embodiments, such as any of the layers 402, 404 and 406.

As shown in FIG. 4A, during a photolithography operation, the photo resist layer 410 is patterned, and trenches 412 are formed. The photo resist layer 410 is for example patterned by the RX or RC mask of FIG. 2A or 3A, the regions of hard mask 406 between the trenches 412 corresponding to the zones RX of FIG. 2A, or the trenches themselves corresponding to the zones RC of FIG. 3A. The trenches 412 are for example of shallower depth than the isolation trenches 104, 106, and for example extend to the sacrificial oxide layer 402, above the semiconductor layer 112, or at the surface of the semiconductor layer 112 in the case that there is no oxide layer 402.

Figure 4B:
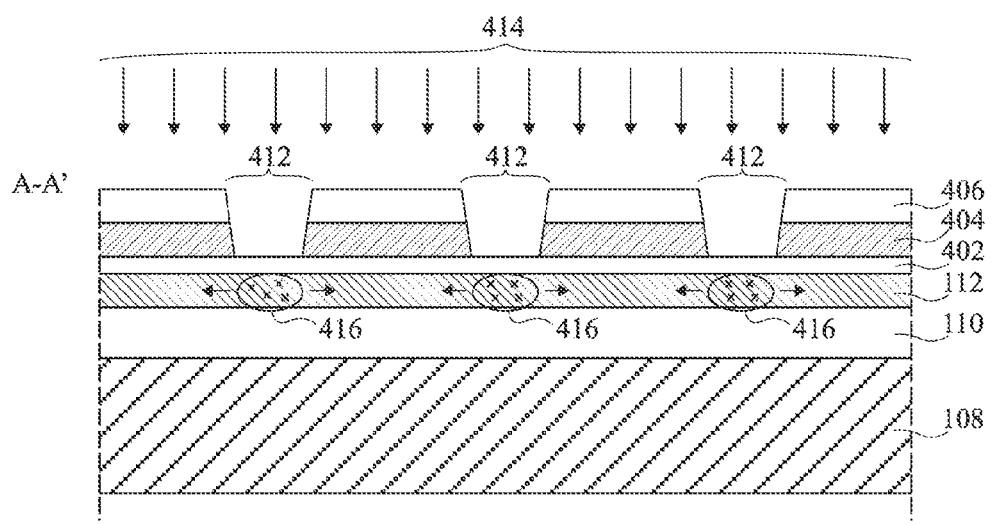

As shown in FIG. 4B, the layers 408 and 410 are for example removed by an appropriate etching step, and an implantation 414 is performed via the trenches 412, to implant atoms into regions 416 of the semiconductor layer 112. For example, the implantation is of germanium, at an energy level of around 40 KeV, for example between 30 KeV and 50 KeV, and at a density of between $10^{14}$ and $5 \times 10^{14}$ atoms/cm$^3$.

This implantation 414 for example renders amorphous the regions 416 of the semiconductor layer 112 below each trench 412. For example, the regions 416 become amorphous SiGe regions in the case that the semiconductor layer 112 is of silicon or SiGe, and the implantation is of germanium.

Annealing is then performed to temporally decrease the viscosity of the insulator layer 110, and also to cause a tensile stress to be exerted by the regions 416 into the portions of the semiconductor layer 112 on each side of these regions 416.

The phenomenon of stress induced by amorphization and annealing is for example discussed in more detail in the publication entitled "Molecular Dynamic Simulation Study of Stress Memorization in Si Dislocations", Tzer-Min Shen et al., Research and Development, Taiwan Semiconductor Manufacturing Company (TSMC), the contents of which is hereby incorporated by reference to the extent allowable by the law.

For example, the insulator layer 110 is formed of silicon dioxide, and the decrease in the viscosity of the insulator layer 110 is achieved by annealing at between 950° C. and 1150° C., for 15 minutes or more. For example, the anneal is performed at between 950° C. and 1050° C. for a duration of between 30 and 60 minutes, or at between 1050° C. and 1150° C. for a duration of between 15 and 45 minutes. Alternatively, the insulator layer 110 could be formed of a material that is naturally of lower viscosity than silicon dioxide, for example of BPSG (boron phosphor silicon glass), and the anneal is performed at between 900° C. and 1100° C. for 5 minutes or more. For example, the anneal is performed at between 900° C. and 1000° C. for a duration of between 15 and 30 minutes, or at between 1000° C. and 1100° C. for a duration of between 5 and 20 minutes. By temporally decreasing the viscosity of the insulator layer 110, the insulator layer 110 for example relaxes such that, when it cools again and the viscosity is increased, the stress in the semiconductor layer 112 is maintained not only by the regions 116, but also by the underlying insulator layer 110.

Figure 4C:
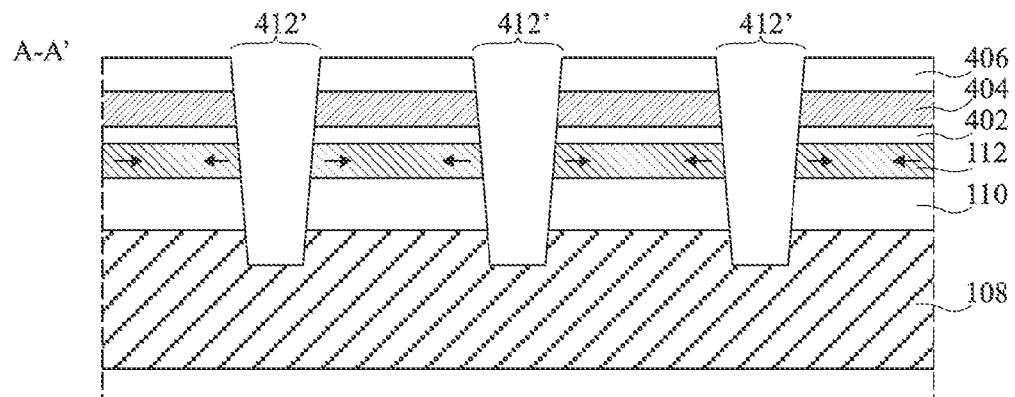

As shown in FIG. 4C, the depth of the trenches 412 is extended by a further etching step to form trenches 412' corresponding to the isolation trenches 104 or 106. In doing so, all or most of the atoms implanted into the semiconductor layer 112 via the trenches 412 are removed, and some relaxation of the semiconductor layer 112 occurs. However, a certain level of stress is mechanically maintained in the semiconductor layer 112 by the insulator layer 110.

For example, in the case that the channel to be formed in the resulting stressed semiconductor layer is an n-type channel, in order to exert a tensile stress on the channel region in the length $L_T$ direction, the implantation is for example applied to the trenches 412 formed by the RC mask of FIG. 3A.

Alternatively, in the case that the channel to be formed in the resulting stressed semiconductor layer is a p-type channel, in order to exert a tensile stress on the channel region in the width $W_T$ direction, the implantation is for example applied to the trenches 412 formed by the RX mask of FIG. 2A.

Figure 5A:
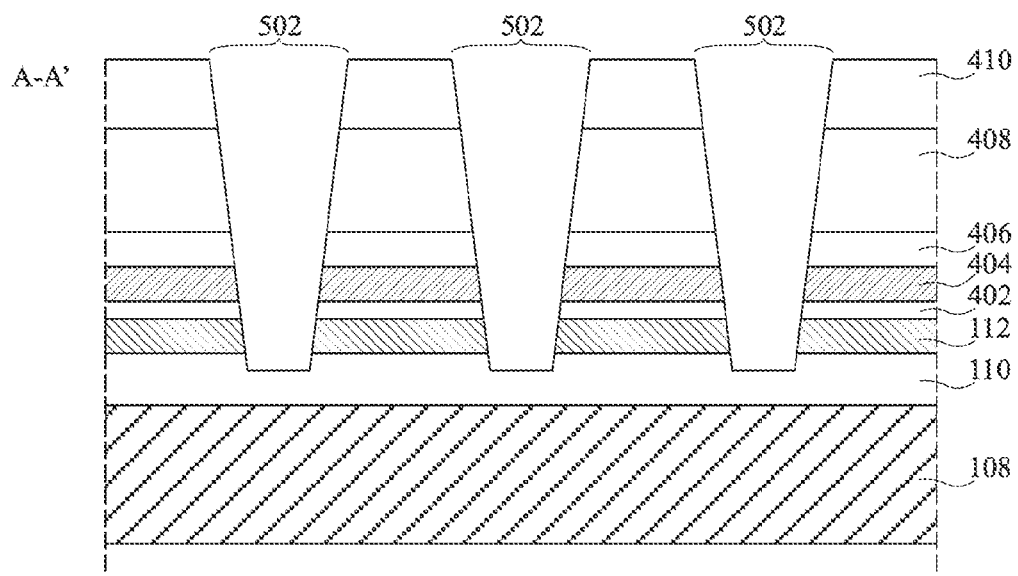
FIGS. 5A to 5C are cross-section views of the SOI structure at various stages during a method of forming a stressed semiconductor layer according to a further example embodiment of the present disclosure.
Figure 5B:
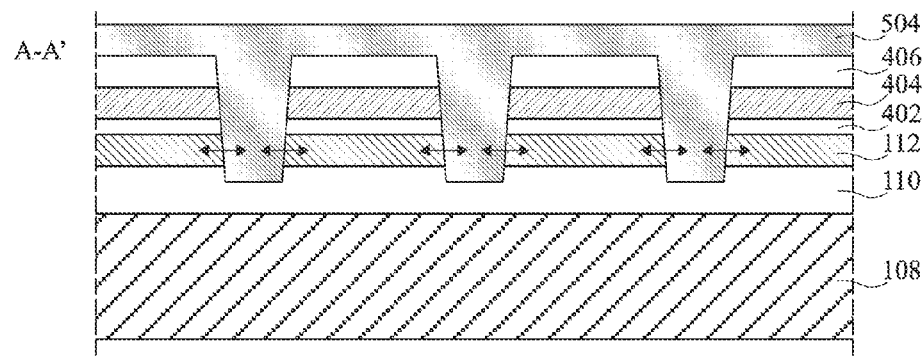
Figure 5C:
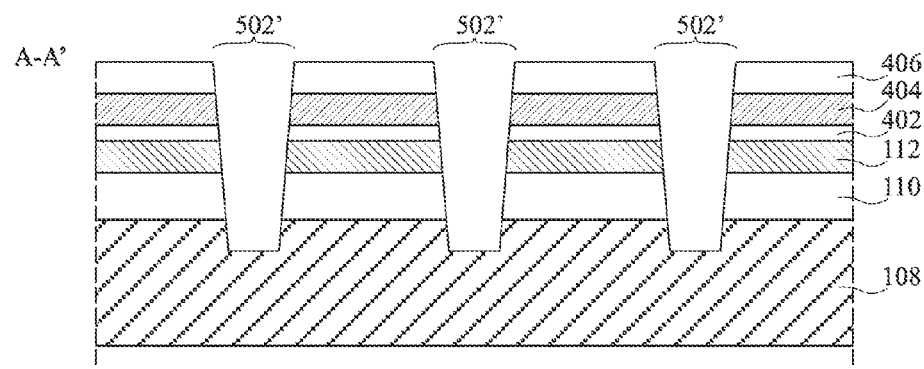

FIGS. 5A to 5C illustrate operations for applying a stress in the semiconductor layer 112 as an alternative to those of FIGS. 4A to 4C described above.

As shown in FIG. 5A, the initial structure is for example substantially identical to that of FIG. 4A, and will not be described again in detail. However, a difference is that, rather than the trenches 412 being formed, which extend to the sacrificial oxide layer 402, deeper trenches 502 are formed in the same locations as the trenches 412. The deeper trenches 502 for example extend to the upper surface of, or partially into, the insulator layer 110.

As shown in FIG. 5B, the layers 408 and 410 are for example removed by an appropriate etching step, and a layer 504 of a stress material is deposited, for example by CVP (chemical vapor deposition), filling the trenches 502. The stress material is one that, when deposited in the trenches 502, exerts a compressive or tensile stress, via the side walls of the trenches 502, on the semiconductor layer 112. For example, the stress material has a coefficient of thermal expansion (CTE) greater or lower than that of the material forming the semiconductor layer 112, such that a stress is exerted when this material is heated.

After the layer 504 has been deposited, an annealing operation is for example performed to heat the stress material and the semiconductor layer 112, causing the tensile or compressive stress to be generated, and also to temporally decrease the viscosity of the insulator layer 110. For example, the insulator layer 110 is formed of silicon dioxide, and the decrease in the viscosity of the insulator layer 110 is achieved by annealing at between 950° C. and 1150° C., for 15 minutes or more. For example, the anneal is performed at between 950° C. and 1050° C. for a duration of between 30 and 60 minutes, or at between 1050° C. and 1150° C. for a duration of between 15 and 45 minutes. Alternatively, the insulator layer 110 could be formed of a material that is naturally of lower viscosity than silicon dioxide, for example of BPSG, and the anneal is performed at between 900° C. and 1100° C. for 5 minutes or more. For example, the anneal is performed at between 900° C. and 1000° C. for a duration of between 15 and 30 minutes, or at between 1000° C. and 1100° C. for a duration of between 5 and 20 minutes. By temporally decreasing the viscosity of the insulator layer 110, the insulator layer 110 for example relaxes such that, when it cools again and the viscosity is increased, the stress in the semiconductor layer 112 is maintained not only by the regions 116, but also by the underlying insulator layer 110.

For example, in the case that the channel to be formed in the resulting stressed semiconductor layer 112 is an n-type channel, layer 112 is for example of silicon, and the deposited material for example has a lower CTE than silicon, in order to exert a tensile stress on the channel region in the length $L_T$ direction when heated. In such a case, the trenches 502 for example correspond to those created by the RC mask of FIG. 3A.

Alternatively, in the case that the channel to be formed in the resulting stressed semiconductor layer is a p-type channel, layer 112 is for example of SiGe, and the deposited material for example has a greater CTE than SiGe, in order to exert a compressive stress on the channel region in the length $L_T$ direction when heated. In such a case, the trenches 502 for example correspond to those created by the RC mask of FIG. 3A.

Examples of the stress material that can be used include Zirconium tungstate $ZrW_2O_8$ having a CTE of $-7.2 \times 10^{-6} K^{-1}$ lower than that of silicon, and Hafnium Oxide $HfO_2$ and titanium nitride TiN each having a CTE greater than that of silicon germanium.

As shown in FIG. 5C, the depth of the trenches 502 is extended by a further etching step to form trenches 502' corresponding to the isolation trenches 104 or 106. In doing so, material deposited in the trenches 502 is substantially or entirely removed, and some relaxation of the semiconductor layer 112 occurs. However, a certain level of stress is maintained mechanically in the semiconductor layer 112 by the insulator layer 110.

FIGS. 6A to 6D are cross-section views illustrating an example of subsequent operations performed, for example, after the operation of FIG. 4C or 5C.

Figure 6A:
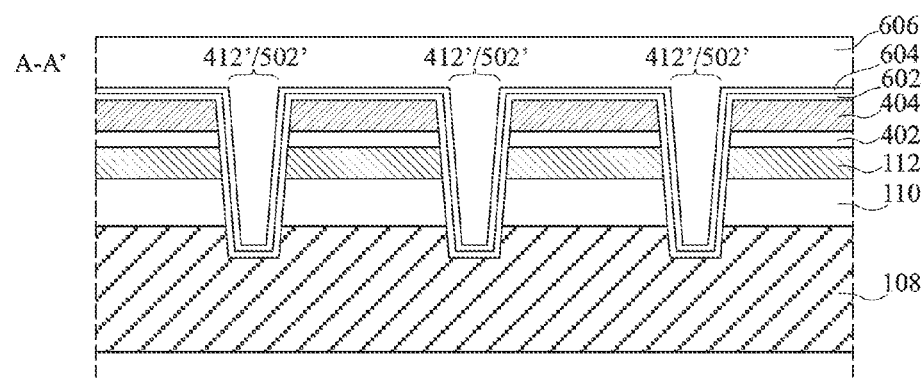
FIGS. 6A to 6D are cross-section views of the SOI structure at various stages during a method of forming a stressed semiconductor layer according to an example embodiment of the present disclosure.

As shown in FIG. 6A, the isolation trenches 104 or 106 are for example formed by lining the trenches 412'/502' with a layer of oxide 602, and then with a layer of SiN 604. The trenches are then filled with a layer 606 of insulating material such as oxide to form the isolation trenches 106 or 104 during the first phase of FIG. 2A or 3A.

The formation, during the second phase of FIG. 2B or 3B, of the further trenches 104 or 106 not yet formed, may be achieved in a standard fashion, using a standard photolithography operation.

Alternatively, during the second phase, prior to forming the further isolation trenches, the semiconductor layer 112 may be stressed again, but in the orthogonal direction, with the same type of stress to the one introduced during the first phase, using the method of FIGS. 4A to 4C.

As a further alternative, during the second phase, prior to forming the further isolation trenches, the semiconductor layer 112 may be stressed again, but in the orthogonal direction, with the same or opposite type of stress to the one introduced during the first phase, using the method of FIGS. 5A to 5C, as will now be described with reference to FIGS. 6B to 6D.

Figure 6B:
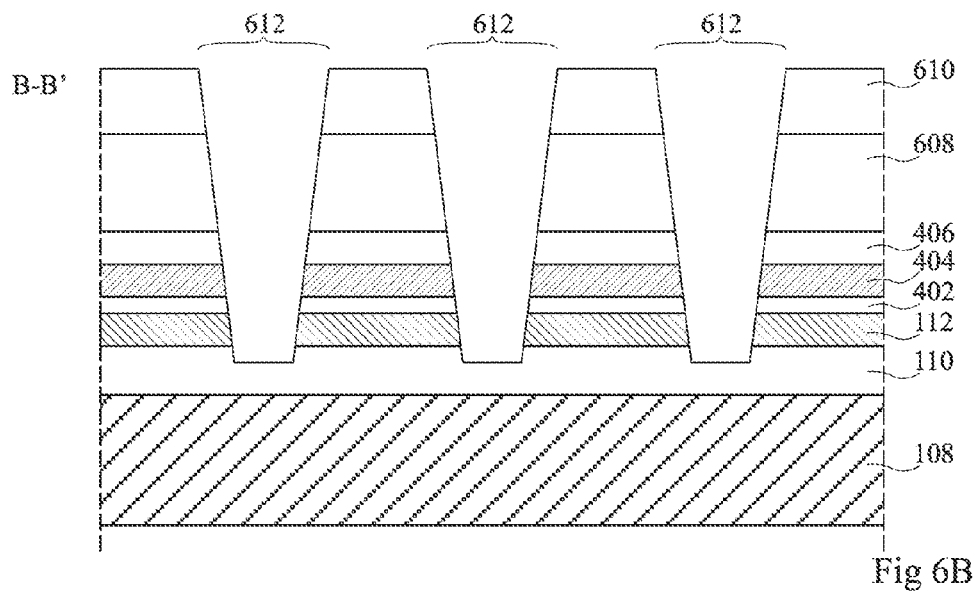
Figure 6C:
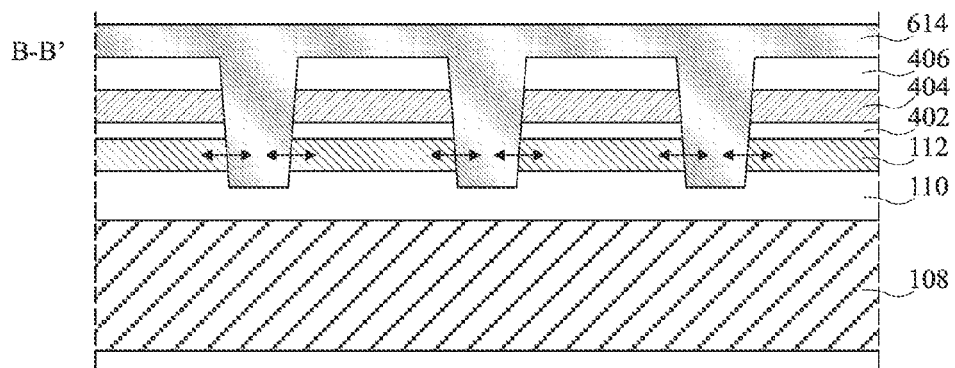
Figure 6D:
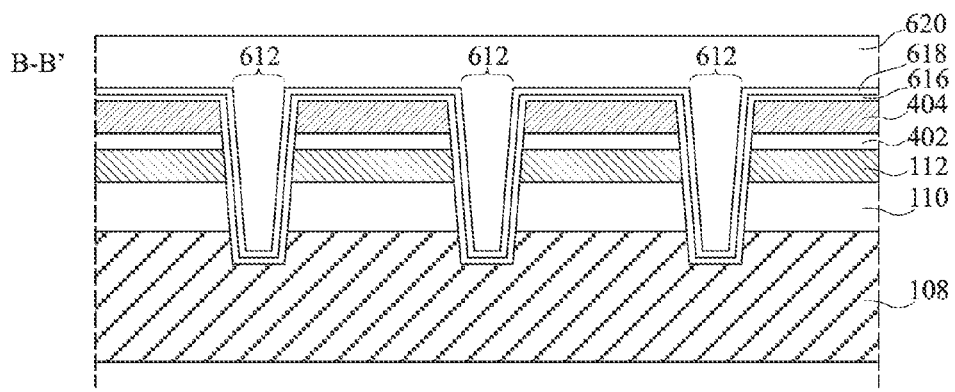

FIGS. 6B to 6D are cross-section views corresponding to cross-sections taken along the dashed line B-B' shown in FIG. 2B, in the horizontal direction and passing perpendicular to the mask zones RC. The cross-sections of FIGS. 6B to 6D also correspond to cross-sections taken along the dashed line B-B' shown in FIG. 3B, in the vertical direction and passing perpendicular to the mask zones RX.

As shown in FIG. 6B, a spin-on carbon (SOC) and/or silicon anti-reflective coating (SiARC) layer 608 is formed over the hard mask layer 406, and for example has a thickness of between 200 and 300 nm. Furthermore, a photo resist layer 610 is formed over layer 608, and for example has a thickness of between 100 and 200 nm.

During a subsequent photolithography operation, the photo resist 610 is patterned, and trenches 612 are formed. The photo resist is for example patterned as the masks shown in FIG. 2B or 3B, the trenches 612 corresponding to the zones RC of FIG. 2B, or the regions of hard mask 406 between the trenches corresponding to the zones RX of FIG. 3B. However, the trenches 612 for example have a shallower depth than the isolation trenches 104, 106, and for example extend down to the surface of, or partially into, the insulator layer 110.

As shown in FIG. 6C, in a subsequent operation, the layers 608 and 610 are for example removed by an appropriate etching, and a layer 614 of a stress material is deposited, for example by CVP (chemical vapor deposition), filling the trenches 612. The stress material is for example selected having a CTE that, when heated, enhances the uniaxial stress in the semiconductor layer 112. Therefore, if a tensile stress was applied to the semiconductor layer 112 during the first phase, during the second phase a compressive stress is for example applied, and vice versa.

As with the operation of FIG. 5B, an annealing operation is for example performed to heat the stress material and the semiconductor layer 112, causing the tensile or compressive stress to be generated, and also to temporally decrease the viscosity of the insulator layer 110. For example, the insulator layer 110 is formed of silicon dioxide, and the decrease in the viscosity of the insulator layer 110 is achieved by annealing at between 950° C. and 1150° C., for 15 minutes or more. For example, the anneal is performed at between 950° C. and 1050° C. for a duration of between 30 and 60 minutes, or at between 1050° C. and 1150° C. for a duration of between 15 and 45 minutes. Alternatively, the insulator layer 110 could be formed of a material that is naturally of lower viscosity than silicon dioxide, for example of BPSG, and the anneal is performed at between 900° C. and 1100° C. for 5 minutes or more. For example, the anneal is performed at between 900° C. and 1000° C. for a duration of between 15 and 30 minutes, or at between 1000° C. and 1100° C. for a duration of between 5 and 20 minutes.

As shown in FIG. 6D, an operation similar to that of FIG. 5C is performed in which the depth of the trenches 612 is extended by a further etching step to form the isolation trenches 104 or 106, the stress material being partially or entirely removed in the process.

Figure 7:
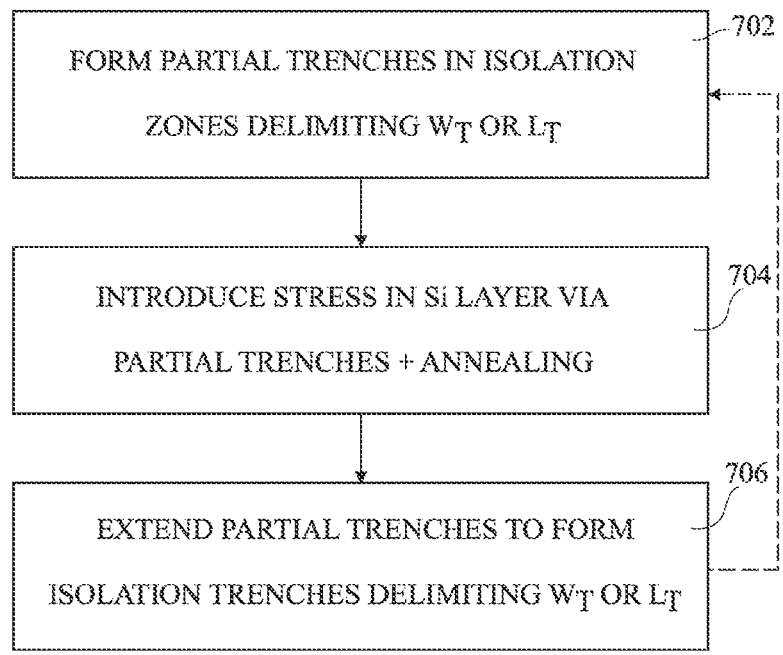
FIG. 7 is a flow diagram illustrating steps in a method of forming a stressed semiconductor layer according to an example embodiment of the present disclosure.

FIG. 7 is a flow diagram illustrating operations in a method of forming a stressed semiconductor layer.

In an operation 702, partial trenches in a first direction are formed in a surface of a semiconductor structure having a semiconductor layer in contact with an insulator layer. The trenches are partial in that they are for example shallower than the full depth isolation trenches that are to be formed. For example the partial trenches stop before the semiconductor layer 112 in the example of FIG. 4A, or extend to the surface of or into the insulator layer 110 in the example of FIG. 5A.

In operation 704, a stress is introduced into the semiconductor layer via the partial trenches, for example by introducing a material, such as atoms implanted into the semiconductor layer, and annealing, as described above with reference to FIG. 4B, or by depositing a stress material in the trenches at the level of the semiconductor layer, and annealing, as described above with reference to FIGS. 5B and 6C. Furthermore, the viscosity of the insulator layer is temporally decreased by the annealing, while maintaining the stress in the semiconductor layer.

In operation 706, the depth of the partial trenches is extended to form isolation trenches in the first direction delimiting a dimension, such as the transistor width $W_T$ or length $L_T$, of a transistor to be formed in the semiconductor structure.

FIGS. 8A to 8D are cross-section views illustrating operations in a method of forming a semiconductor layer with uniaxial stress according to a further example embodiment of the present disclosure. Such a method is for example used to transform a semiconductor layer having biaxial stress into one having uniaxial stress, and/or to conserve or enhance uniaxial stress already present in a semiconductor layer. For example, the method of FIGS. 8A to 8D could be applied to the structure of FIG. 4C or 5C described above, or the steps of FIGS. 6A to 6D could be adapted to incorporate the method of FIGS. 8A to 8D. Alternatively, the method of FIGS. 8A to 8D may be performed independently of any previously described method. It will also be apparent to those skilled in the art how the method of FIGS. 8A to 8D could be applied to the FinFET structure of FIG. 1B.

Figure 8A:
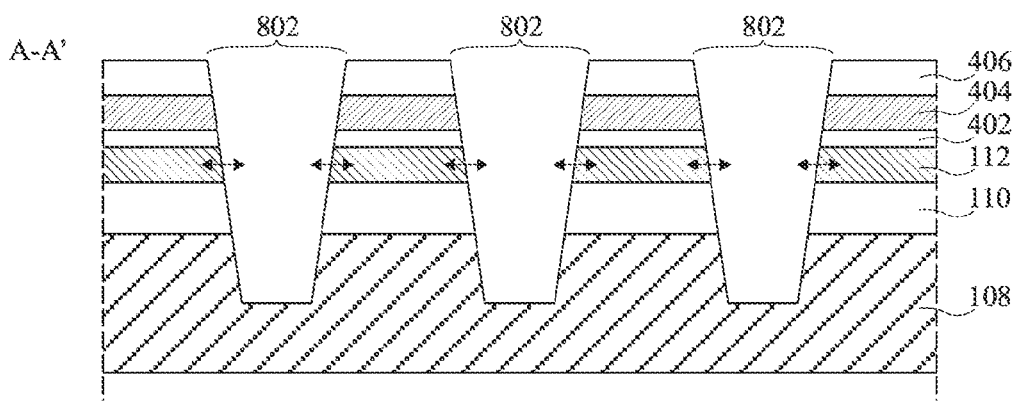
FIGS. 8A and 8B are cross-section views of the SOI structure at various stages during a method of forming a semiconductor layer with uniaxial stress according to an example embodiment of the present disclosure.
Figure 8B:
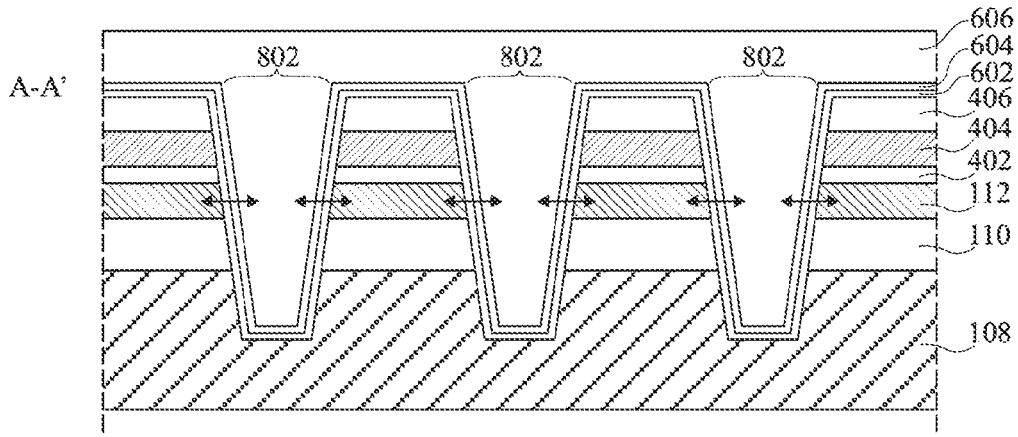

The cross-section views of FIGS. 8A and 8B for example correspond to cross-sections taken along the dashed line A-A' of FIG. 2A or 3A.

As shown in FIG. 8A, the initial structure is for example the same as that of FIGS. 4C and 5C, and the layers have been labelled with like reference numbers and will not be described again in detail. The trenches are however labelled 802 in FIG. 8A, and could correspond to the trenches 412' or 502' described above. Indeed, these trenches 802 correspond to isolation trenches, not yet filled with an insulating material, that delimit one of the dimensions of the transistor to be formed, for example the transistor length $L_T$ or width $W_T$, and for example extend through the SOI structure at least down to the insulator layer 110, and for example into the substrate 108.

FIG. 8B illustrates an operation in which the trenches 802 are lined with the oxide and SiN layers 602 and 604 as described above, and the layer 606 of insulating material, such as oxide, is deposited filling the trenches 802.

As represented by double-headed arrows in FIGS. 8A and 8B, before and/or after the filling of the trenches 802 with oxide, an annealing operation is performed to uniaxially relax the stressed semiconductor layer 112 by temporally decreasing the viscosity of the insulator layer 110. For example, the insulator layer 110 is formed of silicon dioxide, and the decrease in the viscosity of the insulator layer 110 is achieved by annealing at between 950° C. and 1150° C., for 15 minutes or more. For example, the anneal is performed at between 950° C. and 1050° C. for a duration of between 30 and 60 minutes, or at between 1050° C. and 1150° C. for a duration of between 15 and 45 minutes. Alternatively, the insulator layer 110 could be formed of a material that is naturally of lower viscosity than silicon dioxide, for example of BPSG, and the anneal is performed at between 900° C. and 1100° C. for 5 minutes or more. For example, the anneal is performed at between 900° C. and 1000° C. for a duration of between 15 and 30 minutes, or at between 1000° C. and 1100° C. for a duration of between 5 and 20 minutes.

With reference to FIGS. 2A and 3A, it will be noted that the relaxation resulting from this annealing operation is substantially uniaxial, because trenches 104 or 106 have been formed, and thus the semiconductor layer forms strips that maintain stress along their length. Indeed, in the case of FIG. 2A, the trenches corresponding to the isolation trenches 106 have been formed, and thus there will be relaxation in the perpendicular direction, as shown by double headed arrows in this figure. In the case of FIG. 3A, the trenches corresponding to the isolation trenches 104 have been formed, and thus relaxation will occur in the perpendicular direction shown by double headed arrows in this figure.

Figure 8C:
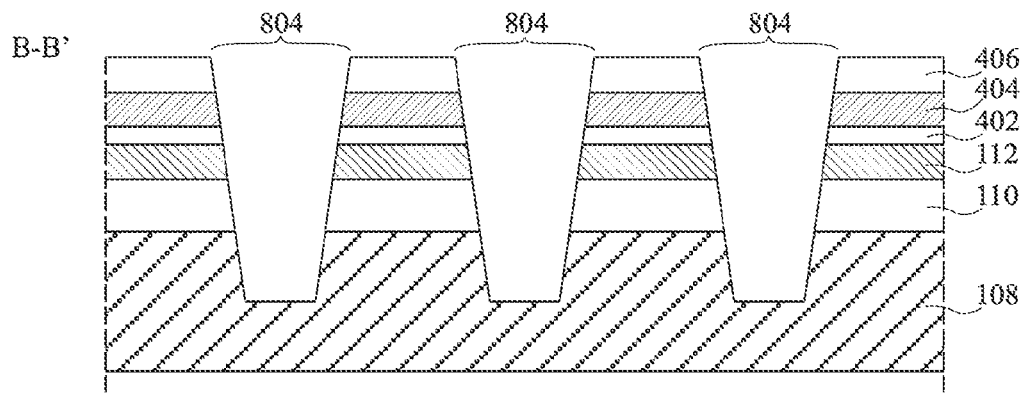
FIGS. 8C and 8D are cross-section views of the SOI structure at various stages during a method of forming a semiconductor layer with uniaxial stress according to an example embodiment of the present disclosure.

FIG. 8C shows an operation, and illustrates the cross-section B-B' of FIG. 2B or 3B. As illustrated, trenches 804 are formed, which for example correspond to trenches 612 of FIG. 6D, or result from a standard photolithography operation.

Figure 8D:
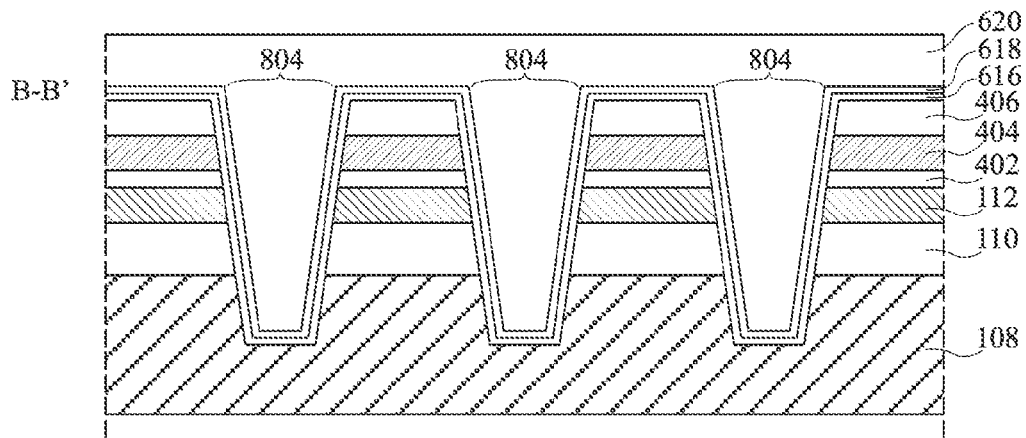

As shown in FIG. 8D, in an operation, the trenches 804 are lined with the oxide and SiN layers 616 and 618 as described above, and the layer 620 of insulating material, such as oxide, is deposited filling the trenches 804. An annealing of the isolation trenches is then performed, for example at the same temperature and duration as the annealing operation described above in relation to FIG. 8B. While annealing the isolation trenches may lead to a further relaxation of the stressed semiconductor layer 112, such a relaxation will be biaxial, and thus the uniaxial nature of the stress will be at least partially maintained. Furthermore, annealing of the isolation trenches may be performed at a reduced temperature, and/or for a reduced duration, in order to limit the decrease in the viscosity of the insulator layer 110, and thus enhance conservation of the uniaxial stress.

Figure 9:
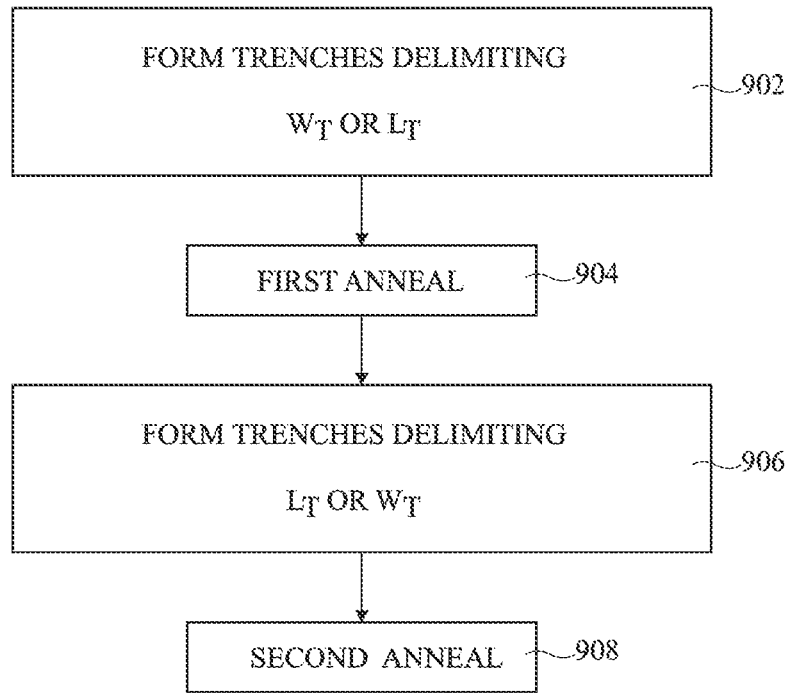
FIG. 9 is a flow diagram illustrating steps in a method of forming a semiconductor layer with uniaxial stress according to an example embodiment of the present disclosure.

FIG. 9 is a flow diagram illustrating operations in a method of forming a semiconductor layer having uniaxial stress.

In a first operation 902, at least two first trenches are formed in the surface of the semiconductor structure in a first direction delimiting a first dimension, such as the transistor width $W_T$ or length $L_T$, of at least one first transistor to be formed in the semiconductor structure. As mentioned above in relation to FIGS. 8A to 8D, the semiconductor layer is for example pre-stressed uniaxially or biaxially.

The formation of the first trenches may or may not include the filling of the trenches with a layer of insulating material.

In operation 904, a first anneal is performed to decrease the viscosity of the insulator layer of the semiconductor structure. For example, the first anneal is performed at a temperature of between 1000° C. and 1150° C., and for a duration of at least 30 minutes.

In operation 906, at least two second trenches are formed in the semiconductor structure in a second direction delimiting a second dimension of the at least one transistor. In the case that the first dimension is the transistor length $L_T$, the second dimension is for example the transistor width $W_T$, and vice versa.

The second trenches are then for example filled with an insulating material, such as a layer of oxide. In the case that the first trenches were not also filled with insulating material during the operation 902, these trenches are also for example filled at the same time as the second trenches.

Optionally, the method further comprises an operation 908 in which a second anneal is performed, to heat the isolation trenches. The second anneal is for example performed at a temperature of between 900 and 1000° C., and for a duration of between 15 and 30 minutes.

For example, in the case that the channel to be formed in the resulting stressed semiconductor layer is an n-type channel, initially the semiconductor layer 112 for example has biaxial tensile stress, and in order to relax the channel region in the width $W_T$ direction, the first trenches for example correspond to those formed using the RX mask of FIG. 2A.

Alternatively, in the case that the channel to be formed in the resulting stressed semiconductor layer is a p-type channel, initially the semiconductor layer 112 for example has biaxial compressive stress, and in order to relax the channel region in the width $W_T$ direction, again the first trenches for example correspond to those formed using the RX mask of FIG. 2A.

Figure 10A:
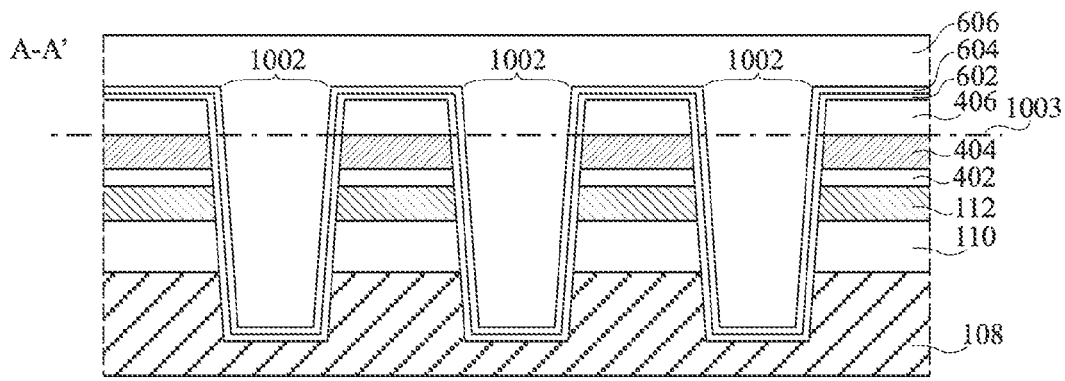
FIGS. 10A to 10C are cross-section views of the SOI structure at various stages during a method of forming a semiconductor layer with uniaxial stress according to an example embodiment of the present disclosure.
Figure 10B:
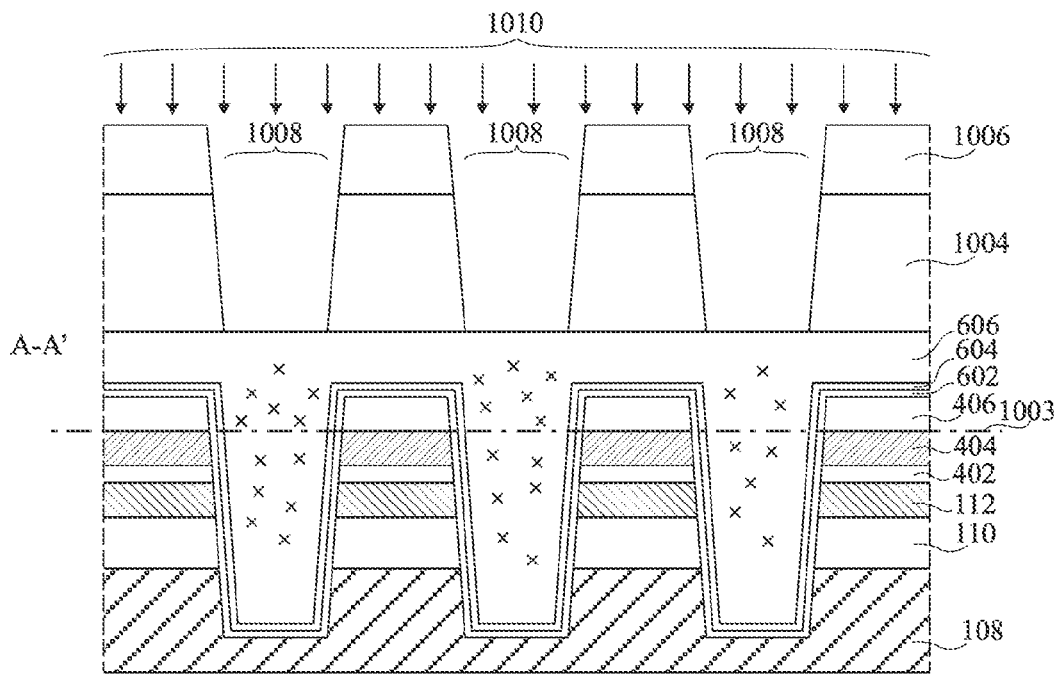
Figure 10C:
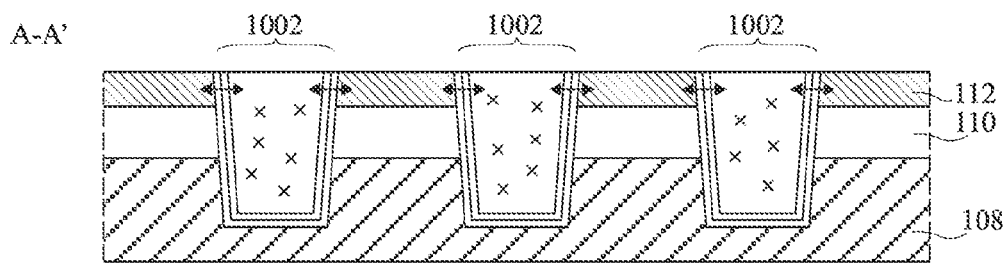

FIGS. 10A to 10C are cross-section views illustrating operations in a method of forming a semiconductor layer with uniaxial stress according to an example embodiment of the present disclosure. In particular, this method is for example used to transform a semiconductor layer having biaxial stress into one having uniaxial stress, and/or to conserve or enhance uniaxial stress already present in a semiconductor layer.

For example, the method of FIGS. 10A to 10C could be applied to the structure of FIG. 4C or 5C described above, or the steps of FIGS. 6A to 6D or FIGS. 8A to 8D could be adapted to incorporate such a method. Alternatively, the method of FIGS. 10A to 10C may be performed independently of any previously described method. Furthermore, rather than being applied to isolation trenches of an SOI structure, the method of FIGS. 10A to 10C could equally be applied to isolation trenches of a bulk silicon structure, or to the trenches between the fins in the FinFET structure of FIG. 1B.

The cross-sections of FIGS. 10A to 10C for example corresponds to the cross-section indicated by the dashed line A-A' in FIG. 2A or FIG. 3A, or to those indicated by the dashed line B-B' in FIG. 2B or FIG. 3B.

As shown in FIG. 10A, the initial structure is for example the same as that of FIGS. 4C and 5C, and the layers have been labelled with like reference numbers and will not be described again in detail. The trenches are however labelled 1002 in FIG. 10A, and for example correspond to the trenches 412' or 502' of FIGS. 4C and 5C, the trenches 612 of FIG. 6D, the trenches 802 of FIG. 8B or the trenches 804 of FIG. 8D. These trenches 1002 correspond to isolation trenches, filled with an insulating material such as oxide, that delimit one of the dimensions of the transistor to be formed, for example the transistor length $L_T$ or width $W_T$, and for example extend through the SOI structure at least into the insulator layer 110, and for example into the substrate 108.

A dashed-dotted line 1003 in FIG. 10A represents a level down to which the device is for example to be planarized. Such a planarization for example leads to a certain relaxation of the stressed semiconductor layer 112, whether the device has an SOI or bulk structure.

As shown in FIG. 10B, a SOC (spin on carbon) or and/or silicon anti-reflective coating (SiARC) layer 1004 is formed over the semiconductor structure, and a photo resist layer 1006 is deposited over layer 1004. A photolithography operation is then used to form trenches 1008, each of which is for example aligned over a corresponding one of the trenches 1002. The trenches 1008 for example each extend to the surface of the layer 606 of insulating material. The trenches are for example formed using a mask similar to the RX or RC masks of FIGS. 2A, 2B, 3A and 3B.

An implantation is then for example performed, into each of the trenches 1002, via the corresponding trenches 1008. For example, the implantation is of a material altering the viscosity of the insulating material filling each of the trenches 1002. In one example, the material is boron or phosphorus, implanted at a concentration of between $10^{12}$ and $10^{14}$ atoms/cm$^3$, and at an energy of between 70 and 150 keV for boron, or at an energy of between 200 and 300 keV for phosphorus, depending on the layers present above the trenches.

As shown in FIG. 10C, in an operation, the device is planarized, for example by a CMP (chemical-mechanical polishing) operation, down to the level of the dashed-dotted line 1003. As shown by double-headed arrows in FIG. 10C, the removal of one or more of the layers overlying the semiconductor layer 112 causes a relaxation, which is enhanced in the direction of the cross-section A-A' due to the decreased viscosity of the insulating material filling the trenches 1002.

Figure 11:
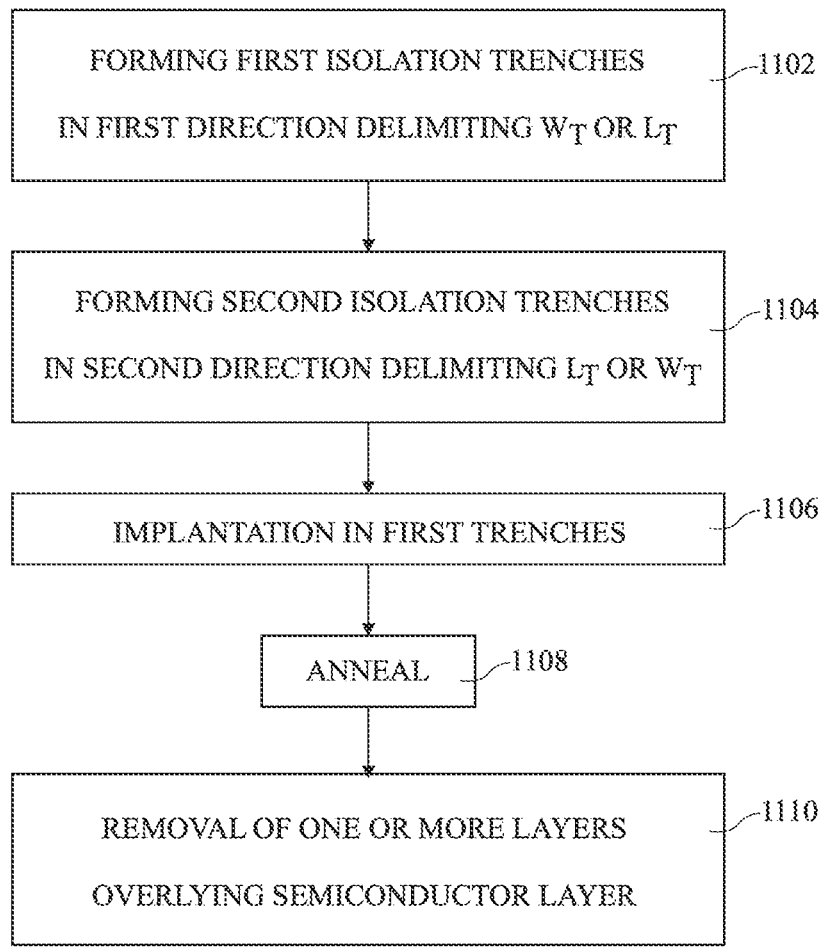
FIG. 11 is a flow diagram illustrating steps in a method of forming a semiconductor layer with uniaxial stress according to an example embodiment of the present disclosure.

FIG. 11 is a flow diagram illustrating operations in a method of forming a semiconductor layer having uniaxial stress according to an example embodiment.

In operation 1102, one or more first isolation trenches are formed in a first direction for delimiting a first dimension, such as the transistor width $W_T$ or length $L_T$, of one or more transistors to be formed.

In operation 1104, one or more second isolation trenches are formed in a second direction for delimiting a second dimension, such as the transistor length $L_T$, or width $W_T$ of the one or more transistors.

In operation 1106, the viscosity of the insulating material filling the first trenches is decreased by selectively implanting atoms of a material into the first isolation trenches and not into the second isolation trenches. In some embodiments, this implantation operation may be performed before the second isolation trenches are formed in operation 1104.

In operation 1108, an annealing operation is optionally performed, corresponding for example to an annealing of the isolation trenches after the implantation operation 1106.

In operation 1110, one or more layers, for example including a hard mask layer, overlying the semiconductor layer, are removed. In some embodiments, these one or more layers include a layer formed directly over the semiconductor layer.

For example, in the case that the channel to be formed in the resulting stressed semiconductor layer is an n-type channel, in order to maintain a tensile stress in the channel region in the transistor length $L_T$ direction, the first trenches for example correspond to those formed using the RC mask of FIG. 3A.

Alternatively, in the case that the channel to be formed in the resulting stressed semiconductor layer is a p-type channel, in order to maintain a compressive stress in the channel region in the length $L_T$ direction, the first trenches for example correspond to those formed using the RX mask of FIG. 2A.

An advantage of the various embodiments described herein is that uniaxial stress may be introduced or enhanced in a semiconductor layer in a simple and low cost manner. Such a uniaxial stress has the advantage of providing an improved mobility of charge carriers in the channel region of a transistor when compared to a semiconductor layer having a similar level of biaxial stress. In particular, it has been found by the present inventors that enhancing uniaxial stress, for example by introducing stress in one direction or by relaxing a biaxially stressed semiconductor layer in one direction, can lead to a performance gain. For example, in a p-type channel, mobility of charge carriers can be enhanced by the presence of compressive stress in the transistor length direction, and a relaxation or tensile stress in the transistor width direction. In an n-type channel, mobility of charge carriers can be enhanced by the presence of tensile stress in the transistor length direction, and a relaxation or compressive stress in the transistor width direction.

Having thus described at least one illustrative embodiment, various alterations, modifications and improvements will readily occur to those skilled in the art.

For example, while specific examples of layers and material that may be used during the various photolithography steps have been described, it will be apparent to those skilled in the art that there are a broad range of equivalent techniques that could be used, employing layers of different materials.

Furthermore, it will be apparent to those skilled in the art that the various features described in relation to the various embodiments described herein may be combined, in alternative embodiments, in any combination.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a semiconductor layer, the method comprising:
   forming, in a semiconductor structure including a stressed semiconductor layer, one or more first isolation trenches in a first direction delimiting a first dimension of at least one transistor to be formed in said semiconductor structure;

forming, in said semiconductor structure, one or more second isolation trenches in a second direction delimiting a second dimension of said at least one transistor, said one or more first and second isolation trenches being at least partially filled with an insulating material having a viscosity; and before or after forming said one or more second isolation trenches, decreasing the viscosity of the insulating material in said one or more first isolation trenches by implanting atoms of a first material into said one or more first isolation trenches, wherein atoms of said first material are not implanted into said one or more second isolation trenches.

2. The method of claim 1, wherein said first material is boron or phosphor.

3. The method of claim 1, wherein said semiconductor structure further comprises a layer overlying said stressed semiconductor layer, the method further comprising:

after implanting atoms, removing said layer.

4. The method of claim 1, wherein:

each of said at least one transistor is a p-channel MOS transistor, and wherein said first dimension is a width of said at least one transistor; or each of said at least one transistor is an n-channel MOS transistor, and wherein said first dimension is a length of said at least one transistor.

5. The method of claim 1, further comprising, prior to implanting atoms, forming, in said semiconductor structure, at least two third trenches in said second direction delimiting said second dimension of at least one second transistor to be formed in said semiconductor structure, wherein:

the at least one transistor is a plurality of transistors;

a first transistor of the plurality of transistors is a p-channel MOS transistor and said first dimension is a width of said first transistor; and a second transistor of the plurality of transistors is an n-channel MOS transistor and said second dimension is a length of said second transistor.

6. The method of claim 1, wherein said stressed semiconductor layer is part of a bulk semiconductor layer.

7. The method of claim 1, wherein said stressed semiconductor layer comprises a plurality of semiconductor fins.

8. The method of claim 1, wherein said semiconductor structure is a semiconductor on insulator structure that includes a semiconductor layer in contact with an insulator layer.

9. The method of claim 8, further comprising, after forming said one or more first isolation trenches and before forming said one or more second isolation trenches:

performing a first anneal to decrease the viscosity of said insulator layer.

10. The method of claim 9, further comprising, after forming said one or more second isolation trenches:

performing a second anneal to further decrease the viscosity of said insulator material of said one or more first and second isolation trenches.

11. The method of claim 10, wherein said first anneal has at least one of a temperature and duration that is greater than said second anneal.

12. The method of claim 10, wherein:

said first anneal is performed at a temperature of between 1000° C. and 1150° C.; and said second anneal is performed at a temperature of between 900 and 1000° C.

13. The method of claim 10, wherein:

said first anneal is performed for a duration of between 30 and 90 minutes; and said second anneal is performed for a duration of between 15 and 30 minutes.

14. The method of claim 10, wherein the first material is boron or phosphor.

15. The method of claim 10, further comprising forming the transistors in the semiconductor structure.

16. The method of claim 8, further comprising, prior to forming said one or more first isolation trenches:

forming, in a surface of said semiconductor structure at least two initial trenches in said first direction;

introducing, via said at least two initial trenches, a stress in said semiconductor layer to provide said stressed semiconductor layer;

temporarily decreasing, by annealing, a viscosity of said insulator layer while maintaining the stress in said semiconductor layer; and extending a depth of said at least two initial trenches to form said one or more first isolation trenches.

17. The method of claim 16, wherein introducing a stress in said semiconductor layer comprises introducing a first material into said SOI structure via said at least two initial trenches, and wherein extending said at least two initial trenches comprises at least partially removing said first material.

18. The method of claim 17, wherein introducing said first material comprises:

implanting atoms of said first material into a region of said semiconductor layer underlying each of said at least two initial trenches; or depositing said first material to at least partially fill each of said at least two initial trenches.

19. A method comprising:

forming, in a semiconductor structure including a stressed semiconductor layer, a plurality of first isolation trenches in a first direction delimiting a first dimension of transistors to be formed in the semiconductor structure, the plurality of first isolation trenches extending into an insulating material having a viscosity;

forming, in the semiconductor structure, a plurality of second isolation trenches in a second direction delimiting a second dimension of the transistors, and decreasing the viscosity of the insulating material in the plurality of first isolation trenches by implanting atoms of a first material into the plurality of first isolation trenches without implanting atoms of the first material into the plurality of second isolation trenches.

20. The method of claim 19, wherein decreasing the viscosity of the insulating material in the plurality of first isolation trenches is performed before forming, in the semiconductor structure, a plurality of second isolation trenches in a second direction delimiting a second dimension of the transistors.

21. A method comprising:

forming, in a semiconductor structure including a stressed semiconductor layer, a plurality of first isolation trenches in a first direction delimiting a first dimension of transistors to be formed in the semiconductor structure;

forming, in the semiconductor structure, a plurality of second isolation trenches in a second direction delimiting a second dimension of the transistors, at least partially filling the first and second isolation trenches with an insulating material having a viscosity;

decreasing the viscosity of the insulating material in the plurality of first isolation trenches by implanting atoms of a first material into the plurality of first isolation trenches without implanting atoms of the first material into the plurality of second isolation trenches; and forming the transistors in the semiconductor structure.

22. The method of claim 21, wherein each of the transistors are delimited by two of the first trenches and two of the second trenches.

* * * * *